(12) United States Patent
Singh et al.

(10) Patent No.: US 11,031,930 B1
(45) Date of Patent: Jun. 8, 2021

(54) ELECTRIC CIRCUIT HAVING A CHARGE PUMP MONITOR

(71) Applicant: Sumitomo Electric Wiring Systems, Ltd., Mie (JP)

(72) Inventors: Vibhor Singh, Farmington Hills, MI (US); Robert C. Grooms, Farmington Hills, MI (US); Keith Griffin, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/924,660

(22) Filed: Jul. 9, 2020

(51) Int. Cl.
*H03K 17/08* (2006.01)
*H03K 17/0812* (2006.01)
*H02M 3/07* (2006.01)

(52) U.S. Cl.
CPC ........ *H03K 17/08122* (2013.01); *H02M 3/07* (2013.01)

(58) Field of Classification Search
CPC ........................... H03K 17/08122; H02M 3/07
USPC ......................................................... 327/536
See application file for complete search history.

(56) References Cited

U.S. PATENT DOCUMENTS

| | | | | |
|---|---|---|---|---|
| 5,426,334 A * | 6/1995 | Skovmand | ............ | H02M 3/073 323/349 |
| 5,914,589 A * | 6/1999 | Erckert | ................ | H03K 17/063 323/282 |
| 6,724,227 B2 * | 4/2004 | Imai | ................. | H03K 17/04123 327/108 |
| 7,649,402 B1 * | 1/2010 | Chen | ........................ | H02M 3/07 327/536 |
| 8,872,552 B2 * | 10/2014 | Asam | ..................... | H03K 3/012 327/108 |
| 10,574,230 B1 * | 2/2020 | Wu | ........................ | H03K 17/666 |
| 2002/0021150 A1 * | 2/2002 | Tuchiya | ............... | H03K 17/302 327/108 |
| 2008/0100272 A1 * | 5/2008 | Yoshio | .................... | H02M 3/07 323/266 |
| 2013/0069711 A1 * | 3/2013 | Chen | ........................ | H02M 3/07 327/536 |
| 2016/0156261 A1 * | 6/2016 | Kaneda | .................... | H02M 3/07 327/536 |
| 2016/0164401 A1 * | 6/2016 | Huang | .................... | G05F 3/262 327/536 |
| 2019/0260373 A1 * | 8/2019 | Yang | ....................... | H02M 3/07 |

* cited by examiner

*Primary Examiner* — Ryan Jager
(74) *Attorney, Agent, or Firm* — Honigman LLP

(57) ABSTRACT

An electric circuit for powering a load using an IPD includes a charge pump and a comparator. A first conductive path connects the charge pump to a positive node of the comparator. A second conductive path connects the battery to a negative node of the comparator and is also connected to a ground. A third conductive path connecting an output of the comparator to the IPD. A second diode is disposed on the third conductive path with the anode connected to the IPD and the cathode connected to an output of the comparator. The comparator generates a low output signal when the charge pump voltage is less than the battery voltage so as to provide a path for current from the battery to flow through the first diode into the output of the comparator and to the ground.

12 Claims, 5 Drawing Sheets

ELECTRIC CIRCUIT HAVING A CHARGE PUMP MONITOR

TECHNICAL FIELD

The present specification generally relates to an electric circuit, in particular an electric circuit configured to protect a semiconductor switch from being damaged by a malfunctioning charge pump.

BACKGROUND

Electric circuits configured to power to an intelligent powered device 200 so as to direct power to a load are known. A power storage device 202, such as a battery, is used to supply power to the load 204. The intelligent powered device 200 turns on and off so as to power a load 204. A depiction of the such an electric circuit is provided in FIG. 1.

The electric circuit includes a reverse current semiconductor switch 206 which is actuated by a charge pump 208. The charge pump 208 delivers a voltage greater than the voltage of the battery 202 to the gate terminal of the semiconductor switch 206. The semiconductor switch 206 is configured to turn on when the voltage at the gate terminal is greater than the voltage at the source terminal of the semiconductor switch.

In the event that the charge pump malfunctions, the voltage at the gate terminal fluctuates, thus turning the semiconductor switch on and off 206. This may damage the intelligent powered device.

According, it remains desirable to have an electric circuit configured to prevent the intelligent powered device from being damaged in the event the charge pump malfunctions.

SUMMARY

An electric circuit for supplying a power from a battery to a load is provided. An intelligent powered device ("IPD") is interposed between the battery and the load. The IPD is configured to turn on or off so as to power the load. The electric circuit includes a charge pump for generating a charge pump voltage.

The electric circuit includes a comparator having a positive node and a negative node and a ground node. A first conductive path connects the charge pump to the positive node. A first diode is disposed on the first conductive path. The first diode is interposed between the charge pump and the positive node of the comparator. The first diode is configured to prevent a current from flowing from the charge pump to the positive node of the comparator when a charge pump voltage is below a predetermined voltage.

The electric circuit further includes a second conductive path connecting the battery to the negative node. The second conductive path also connects the battery to a ground. The electric circuit further includes a third conductive path connecting an output of the comparator to the IPD. A second diode is disposed on the third conductive path. The second diode includes an anode on a side connected to the IPD and a cathode on a side of the second diode connected to an output of the comparator.

The comparator is configured to generate a high output signal when the charge pump voltage is greater than the battery voltage, wherein the second diode generates an open circuit in the third conductive path allowing the battery to power the IPD so as to turn the IPD on and provide power to the load. The comparator is configured to generate a low output signal when the charge pump voltage is less than the battery voltage wherein the a low voltage potential is created on the cathode of the second diode relative to the anode of the second diode causing current from the battery to flow through the first diode into the output of the comparator and to the ground node.

In one aspect, the electric circuit includes a semiconductor switch, interposed between the battery and the IPD. In another aspect, the first diode is a Zener diode. The Zener diode is configured to prevent an electric current from reaching the comparator when the charge pump voltage is below a predetermined threshold. In another aspect, the electric circuit may further include voltage dividers for regulating power. In another aspect, the electric circuit may further include a capacitor for stabilizing a voltage and/or reducing noise.

In another aspect, an electric system having a battery configured to power a load is provided. The electric system includes a charge pump. A first semiconductor switch has a gate terminal, a source terminal and a drain terminal. A comparator is configured to measure a voltage potential. The comparator includes a positive node, a negative node and an output.

An intelligent powered device is interposed between the switch and the load. A first conductive path connects the charge pump to the positive node. A first diode is disposed on the first conductive path and is configured prevent a current from flowing charge pump to the positive node of the comparator when a charge pump voltage is below a predetermined voltage. A second conductive path connects the battery to the negative node. The second conductive path also connects the battery to a ground. A third conductive path connects an output of the comparator to the IPD. A second diode is disposed on the third conductive path. An anode of the second diode is on a side connected to the semiconductor switch and a cathode of the second diode is connected to an output of the comparator.

The comparator is configured to generate a high output signal when the charge pump voltage is greater than the battery voltage, wherein the second diode generates an open circuit in the third conductive path allowing the battery to power the IPD so as to turn the IPD on, and wherein the comparator is configured to generate a low output signal when the charge pump voltage is less than the battery voltage, turning off the first semiconductor switch and wherein the a low voltage potential is created on the cathode of the second diode relative to the anode of the second diode causing current from the battery to flow through the first diode into the output of the comparator and to the ground node.

In one aspect, the electric system is used in a vehicle. In another aspect, the electric system, the first diode is a Zener diode. The Zener diode is configured to prevent an electric current from reaching the comparator when the charge pump voltage is below a predetermined threshold. In another aspect, the electric circuit may further include voltage dividers for regulating power. In another aspect, the electric circuit may further include a capacitor for stabilizing a voltage and/or reducing noise.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in FIG. 1 is a schematic view showing a conventional electric circuit;

DETAILED DESCRIPTION OF PREFERRED EMBODIMENTS

Referring generally to the figures, embodiments of an electric circuit is provided. The electric circuit is configured to protect an intelligent powered device in the event of a charge pump malfunction. In particular, the electric circuit is configured to direct a current from a battery to ground when a charge pump malfunctions. The electric circuit may be part of an electric system. The electric system may be used in various platforms, illustratively including an automotive vehicle.

Figure 1:
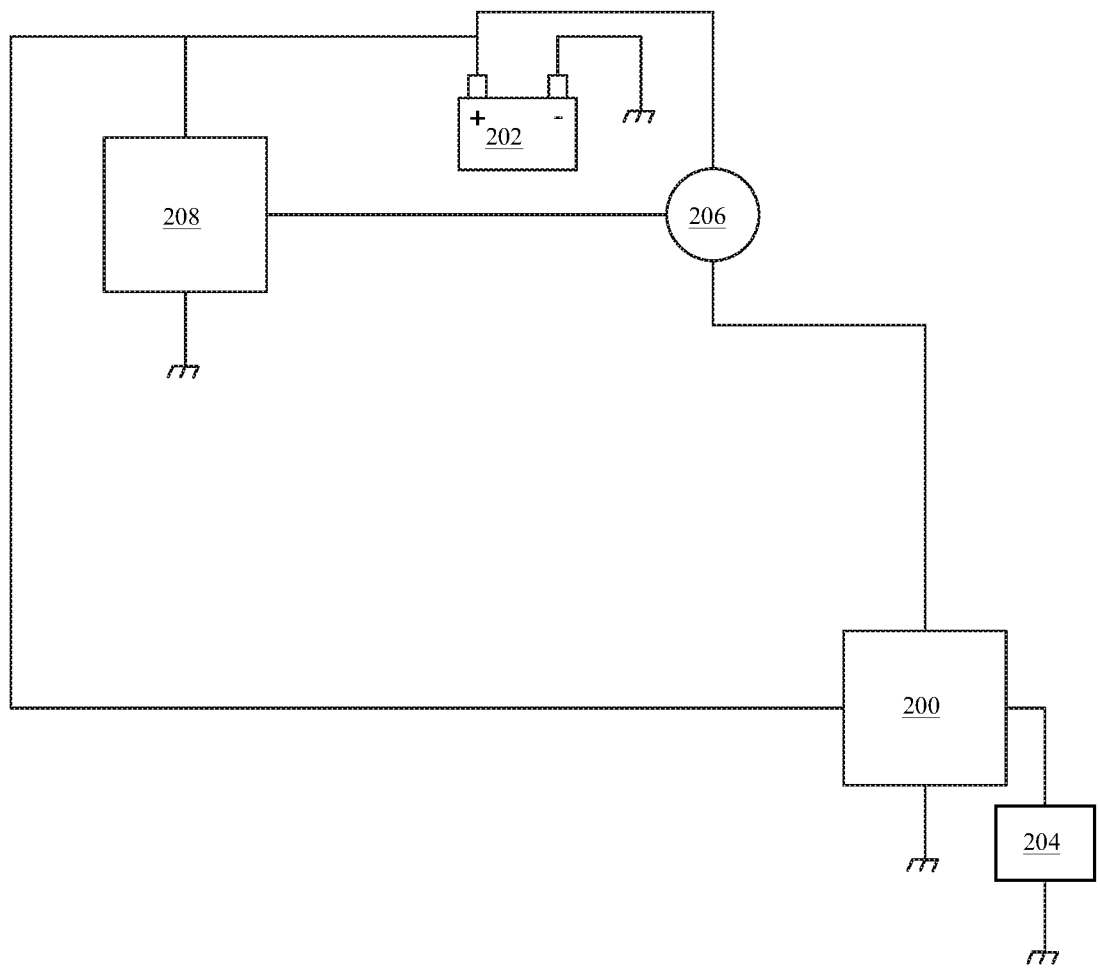

With reference now to FIG. 1, an electric circuit 10 for supplying a power from a battery 12 to a load 14 is provided. The electric circuit 10 includes an IPD 16 configured to drive a high current to the load 14. For use herein, the term "IPD" refers to a switching device configured to turn on and off. When the IPD 16 is on, the IPD 16 drives a high current to the load 14. As used herein, an IPD is an Intelligent Power Device, commonly known as a "Smart FET" having components configured to turn off the IPD in upon the occurrence of a damaging event, such as a high temperature, over current, overvoltage, and the like.

The electric circuit 10 includes a charge pump 18 and a comparator 20. The comparator 20 includes a positive node 20*a* and a negative node 20*b* and an output 20*c*. The comparator 20 is configured to generate an output signal based upon a voltage potential between the negative node 20*b* and the positive node 20*a*. In particular, the comparator 20 is configured to generate a high output signal when the voltage at the positive node 20*a* is greater than the voltage at the negative node 20*b* and generate a low output signal when the voltage at the positive node 20*a* is smaller than the voltage at the negative node 20*b*. As used herein, a high output signal is voltage greater than the voltage at the input of the TPD. In this case, the high output signal is the voltage of the battery 12.

A first conductive path P1 connects the charge pump 18 to the positive node 20*a*. A first diode 22 is disposed on the first conductive path P1 and is interposed between the charge pump 18 and the positive node 20*a* of the comparator 20. The first diode 22 is configured prevent a current from flowing from the charge pump 18 to the positive node 20*a* of the comparator 20 when a charge pump voltage is below a first predetermined voltage.

The electric circuit 10 further includes a second conductive path P2 connecting the battery 12 to the negative node 20*b*. The second conductive path P2 also connects the battery 12 to a ground. The electric circuit 10 further includes a third conductive path P3 connecting an output 20*c* of the comparator 20 to the IPD 16. A second diode 24 is disposed on the third conductive path P3. The second diode 24 includes an anode on a side connected to the IPD 16 and a cathode on a side of the second diode 24 connected to an output 20*c* of the comparator 20. The second diode 24 is configured to provide a current path from the anode to the cathode when a voltage potential as measured from the anode to the cathode is above a predetermined voltage and block current when the voltage potential as measured from the anode to the cathode is below the predetermined voltage.

The comparator 20 is configured to generate a high output signal when the charge pump voltage is greater than the battery voltage, wherein the second diode 24 generates an open circuit in the third conductive path P3 allowing the battery 12 to power the IPD 16 so as to turn the IPD 16 on and provide power to the load 14. The comparator 20 is configured to generate a low output signal when the charge pump voltage is less than the battery voltage wherein the a low voltage potential is created on the cathode of the second diode 24 relative to the anode of the second diode 24 causing current from the battery 12 to flow through the first diode 22 into the output 20*c* of the comparator 20 and to the ground node.

In one aspect of the electric circuit 10, the first diode 22 is a Zener diode. The Zener diode has a cathode that is connected to the charge pump 18 and an anode is connected to positive node 20*a* of the comparator 20. Accordingly, current from the charge pump 18 is blocked from reaching the positive node 20*a* of the comparator 20 when the voltage from the charge pump 18 is less than a Zener voltage.

In one aspect, the electric circuit 10 may further include a third diode 26. The third diode 26 is interposed between the battery 12 and the negative node 20*b* of the comparator 20. A fourth diode 28 may be interposed between the battery 12 and the IPD 16. The third and fourth diodes 26, 28 are configured to prevent a reverse current from flowing to the battery 12.

The electric circuit 10 may further include components to regulate power. For example, the electric circuit 10 may further include a first voltage divider 30 disposed on the first conductive path P1 between the charge pump 18 and the positive node 20*a*. The first voltage divider 30 is configured to divide the charge pump voltage at a first node ("A"). The first voltage divider 30 includes a first resistor R1 and a second resistor R2. The first resistor R1 and the second resistor R2 are on opposite sides of the first node "A", wherein the first resistor R1 is interposed between the first node "A" and the first diode 22. The second resistor R2 is connected to ground. As such the first voltage divider 30 is configured to reduce the voltage received by the positive node 20*a* of the comparator 20. It should be appreciated that the resistance of the first and second resistors R1, R2 are designed to provide a voltage that falls within the specification of the comparator 20.

In another aspect, the electric circuit 10 includes a second voltage divider 32 disposed on the second conductive path P2 between the battery 12 and the negative node 20*b*. The second voltage divider 32 includes a third resistor R3 and a fourth resistor R4 disposed on opposite sides of a second node "B". The third resistor R3 is interposed between the second diode 24 and the second node "B". The fourth resistor R4 is interposed between the second node "B" and ground. As such the second voltage divider 32 is configured to reduce the voltage received by the negative node 20*b* of the comparator 20. It should be appreciated that the resistance of the third and fourth resistors R3, R4 are designed to provide a voltage that falls within the specification of the comparator 20.

In another aspect, the electric circuit 10 is configured to reduce noise from the battery 12. In such an aspect, the electric circuit 10 may further include a first capacitor C1 in parallel to the second conductive path P2 and is also connected to the ground. A fifth resistor R5 is interposed between the first capacitor C1 and the second conductive path P2. The fifth resistor R5 is configured to drop the voltage across the first capacitor C1. As such, it should be appreciated that the resistance of the fifth resistor R5 is based upon the operational specification of the first capacitor C1 and the voltage output of the battery 12.

In yet another aspect, the electric circuit 10 may further include a second capacitor C2. The second capacitor C2 connects the first conductive path P1 to the second conductive path P2, so as to regulate power from the charge pump 18 and the battery 12. In particular, the second capacitor C2 helps reduce noise so as to help ensure that the voltage potential difference read by comparator 20 is accurate.

Figure 2:
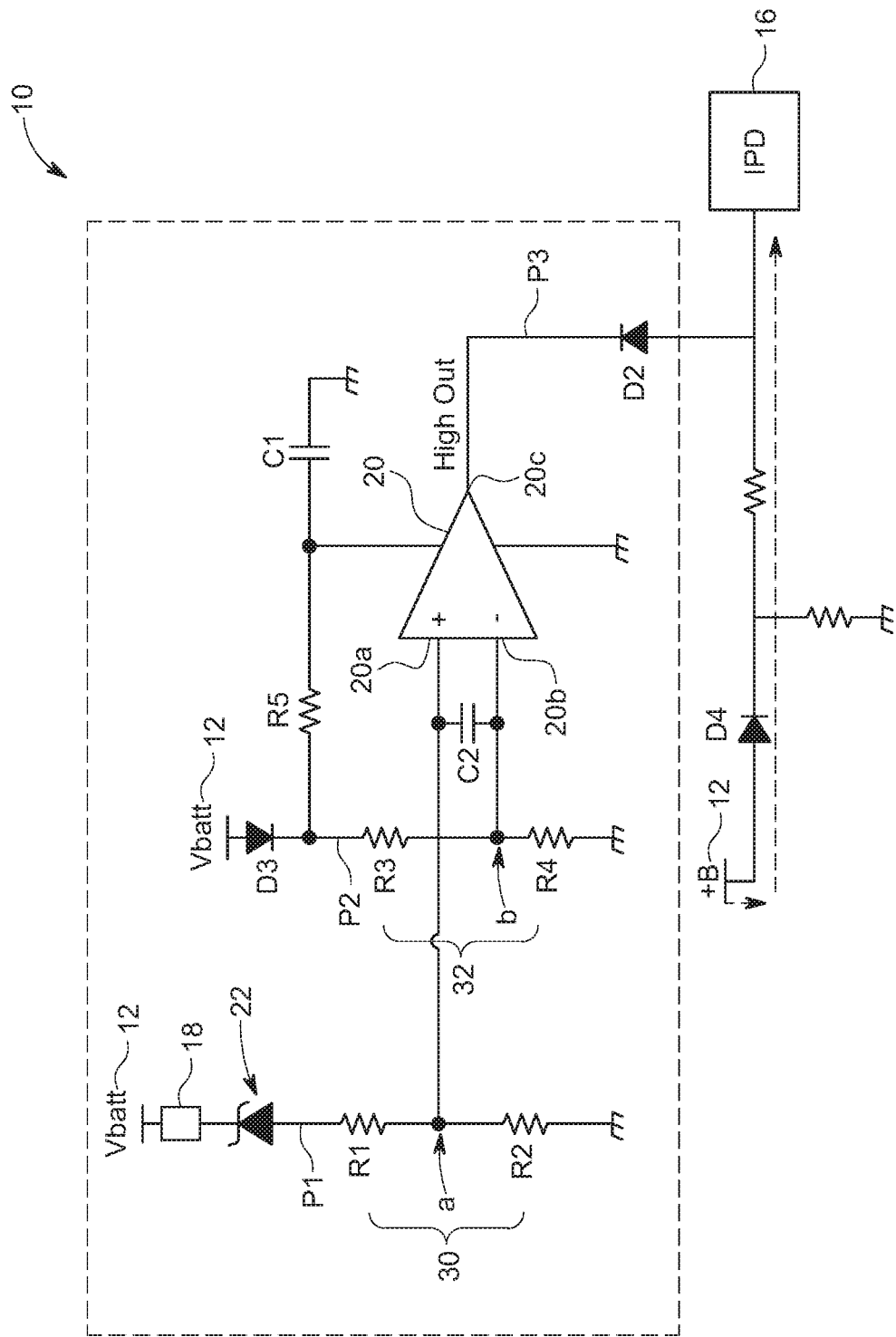
FIG. 2 is a schematic view depicting an electric circuit according to one or more embodiments described herein.

With again to FIG. 2, an illustrative description of the electric circuit 10 is provided. The first diode 22 is a Zener diode having a zener voltage of 6.8V. In this instance, the Zener voltage of the Zener diode is the first predetermined voltage. The first, second, third and fourth resistors R1, R2. R3, R4 have a resistance of 2201 kΩ. The fifth resistor R5 has a resistance of 100Ω. The first capacitor C1 has a capacitance of 0.1 µF and the second capacitor C2 has a capacitance of 47 pF. The second and third diodes 24, 26 have a voltage potential of 0.7V and the fourth diode 28 has a voltage potential of 0.7V.

With reference again to FIG. 2, when the charge pump 18 is functioning properly, a constant voltage is measured at the positive node 20a. As is known, the charge pump 18 provides a voltage greater than the voltage of the battery 12. Accordingly, the voltage at the positive node 20a of the comparator 20 is greater than the voltage at the negative node 20b, wherein the comparator 20 outputs a high signal and thus no current is passed through the second diode 24. As such, power is supplied to the IPD 16, turning on the IPD 16 so as to supply power to the load 14, as indicated by the arrow.

Figure 3:
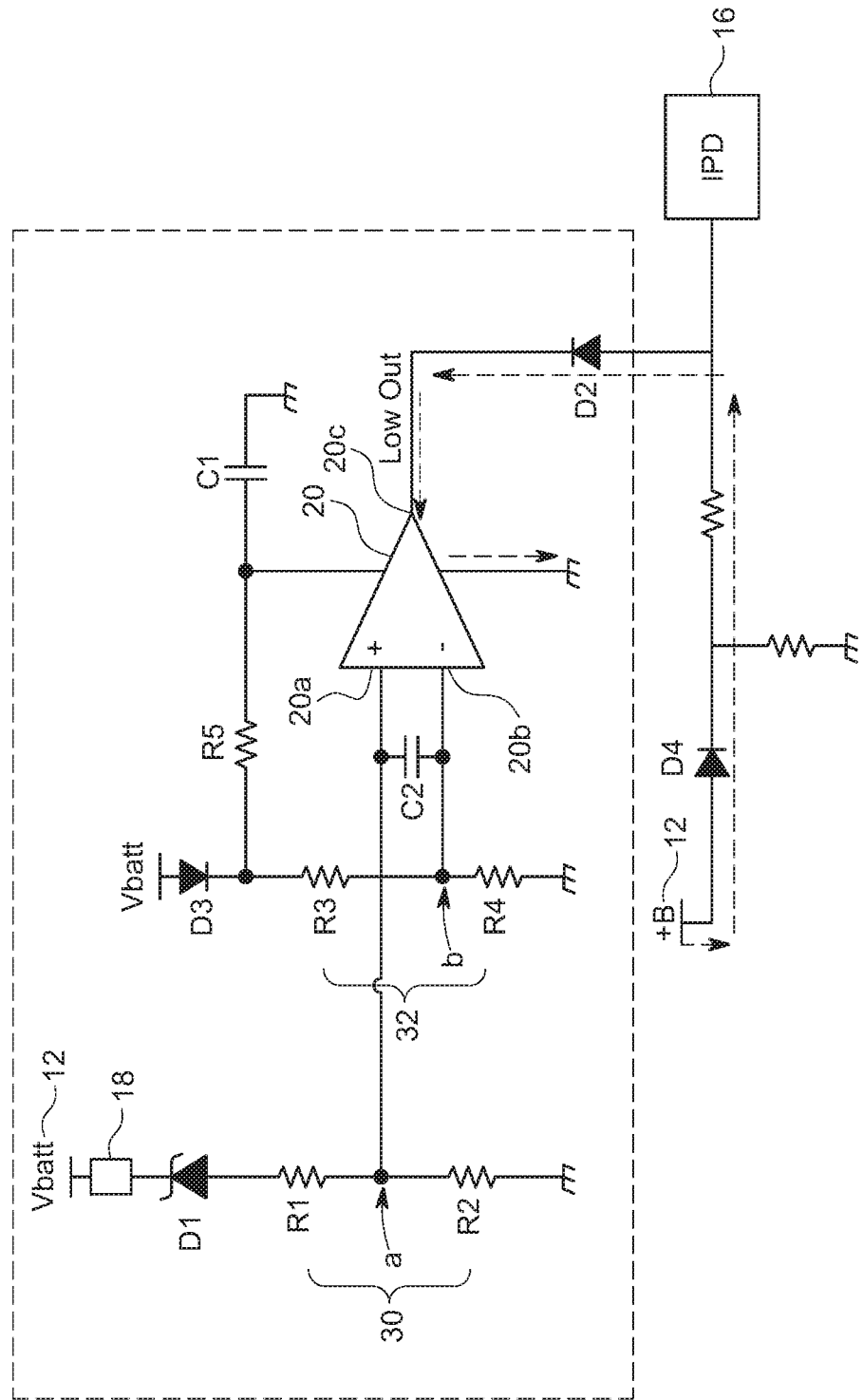
FIG. 3 is a schematic view of the electric circuit shown in FIG. 2, showing the IPD protected from a power surge.

With reference now to FIG. 3, a description of the electric circuit 10 having a malfunctioning charge pump 18 is provided. For instance, if the charge pump 18 fails to generate a charge pump voltage, the voltage at the negative node 20b of the comparator 20 is higher than the voltage at the positive node 20a of the comparator 20. As such, the comparator 20 generates a low output signal wherein the voltage at the cathode of the second diode 24 is low and the voltage at the anode of the second diode 24 is high, wherein current flowing from the battery 12 flows through the second diode 24, into the comparator 20 and into ground, as indicated by the arrow. Thus, the IPD 16 is turned off and is protected from the effects of a malfunctioning charge pump 18.

Figure 4:
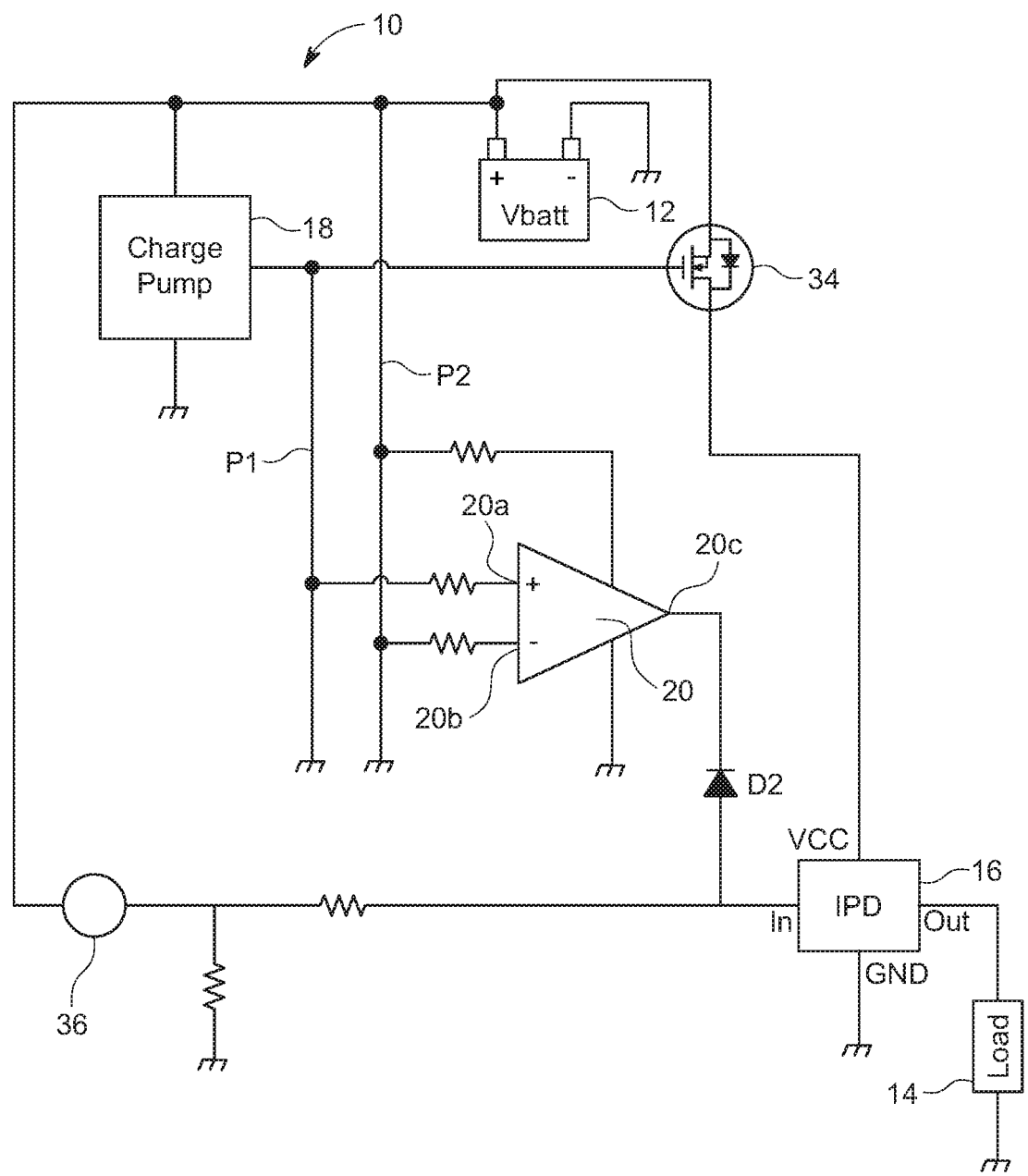
FIG. 4 is a schematic view depicting an electric system according to one or more embodiments described herein.

With reference now to FIG. 4 an electric circuit 10 according to a second embodiment is provided. In the second embodiment, the electric circuit 10 is configured to supply power from a battery 12 to a load 14. The electric circuit 10 includes an IPD 16 configured to drive a high current to the load 14.

The electric circuit 10 includes a charge pump 18 configured to provide power to a first semiconductor switch 34. The first semiconductor switch 34 includes a gate terminal "GT", a source terminal "ST" and a drain terminal "DT". Preferably, the first semiconductor switch 34 is configured to protect the load 14 from a reverse battery condition. In one aspect, the first semiconductor switch 34 is a multi-channel semiconductor switch, such as an N-Channel FET. As used herein, a reverse battery condition refers to a condition where a connection to the battery 12 is reversed, e.g. the positive terminal of the battery 12 is connected to ground and the negative terminal of the battery 12 is connected to the electric circuit 10. In such an instance, the first semiconductor switch 34 is turned off, thus preventing a reverse current from the load 14 from damaging the battery 12 or other components.

The charge pump 18 is powered by the battery 12 and generates a voltage greater than the output voltage of the battery 12. The charge pump 18 is coupled to the gate terminal GT of the first semiconductor switch 34. The source terminal ST of the first semiconductor switch 34 is coupled to the battery 12. The drain terminal DT of the first semiconductor switch 34 is coupled to the IPD 16.

The electric circuit 10 includes a comparator 20 having a positive node 20a, a negative node 20b and an output 20c. A first conductive path P1 connects the charge pump 18 to the positive node 20a. The electric circuit 10 further includes a second conductive path P2 connecting the battery 12 to the negative node 20b. The second conductive path P2 also connects the battery 12 to a ground.

The electric circuit 10 further includes a third conductive path P3 connecting an output 20c of the comparator 20 to the IPD 16. A second diode 24 is disposed on the third conductive path P3. The second diode 24 includes an anode on a side connected to the IPD 16 and a cathode on a side of the second diode 24 connected to an output 20c of the comparator 20. The second diode 24 is configured to provide a current path from the anode to the cathode when a voltage potential as measured from the anode to the cathode is above a predetermined voltage and block current when the voltage potential as measured from the anode to the cathode is below the predetermined voltage. The electric circuit 10 may include a plurality of resistors for regulating voltage to the comparator 20. It should be appreciated that the specification of the resistors is based upon the operational specification of components such as the battery 12, the charge pump 18 and the comparator 20.

The comparator 20 is configured to generate a high output signal when the charge pump voltage is greater than the battery voltage, wherein the second diode 24 generates an open circuit in the third conductive path P3 allowing the battery 12 to power the IPD 16 so as to turn the IPD 16 on and provide power to the load 14. The comparator 20 is configured to generate a low output signal when the charge pump voltage is less than the battery voltage wherein the a low voltage potential is created on the cathode of the second diode 24 relative to the anode of the second diode 24 causing current from the battery 12 to flow through the first diode 22 into the output 20c of the comparator 20 and to the ground node.

In one aspect of the electric circuit 10, a second semiconductor switch 36 is interposed between the IPD 16 and the battery 12. The second semiconductor switch 36 being actuated by a controller so as to connect the battery 12 to the input of the IPD 16.

When the charge pump 18 is functioning properly, a constant voltage is measured at the positive node 20a. Accordingly, as described above, the voltage at the positive node 20a of the comparator 20 is greater than the voltage at the negative node 20b, wherein the comparator 20 outputs a high signal and thus no current is passed through the second diode 24. Concurrently, the voltage at the gate terminal GT of the first semiconductor switch 34 is greater than the voltage at the source terminal ST of the first semiconductor switch 34 thus the first semiconductor switch 34 is turned on allowing current from the battery 12 to reach the IPD 16, turning on the IPD 16 which supplies power to the load 14.

In instances where the charge pump 18 fails to generate a charge pump voltage, the voltage at the negative node 20b of the comparator 20 is higher than the voltage at the positive node 20a of the comparator 20. Concurrently, the voltage at the gate terminal GT of the first semiconductor switch 34 is smaller than the voltage at the source terminal ST of the first semiconductor switch 34 thus the first semiconductor switch 34 is turned off.

The comparator 20 generates a low output signal wherein the voltage at the cathode of the second diode 24 is low and the voltage at the anode of the second diode 24 is high, wherein current flowing from the battery 12 flows through the second diode 24, into the comparator 20 and into ground. Thus, the IPD 16 is turned off as no input is received and is protected from the effects of a malfunctioning charge pump 18.

Figure 5:
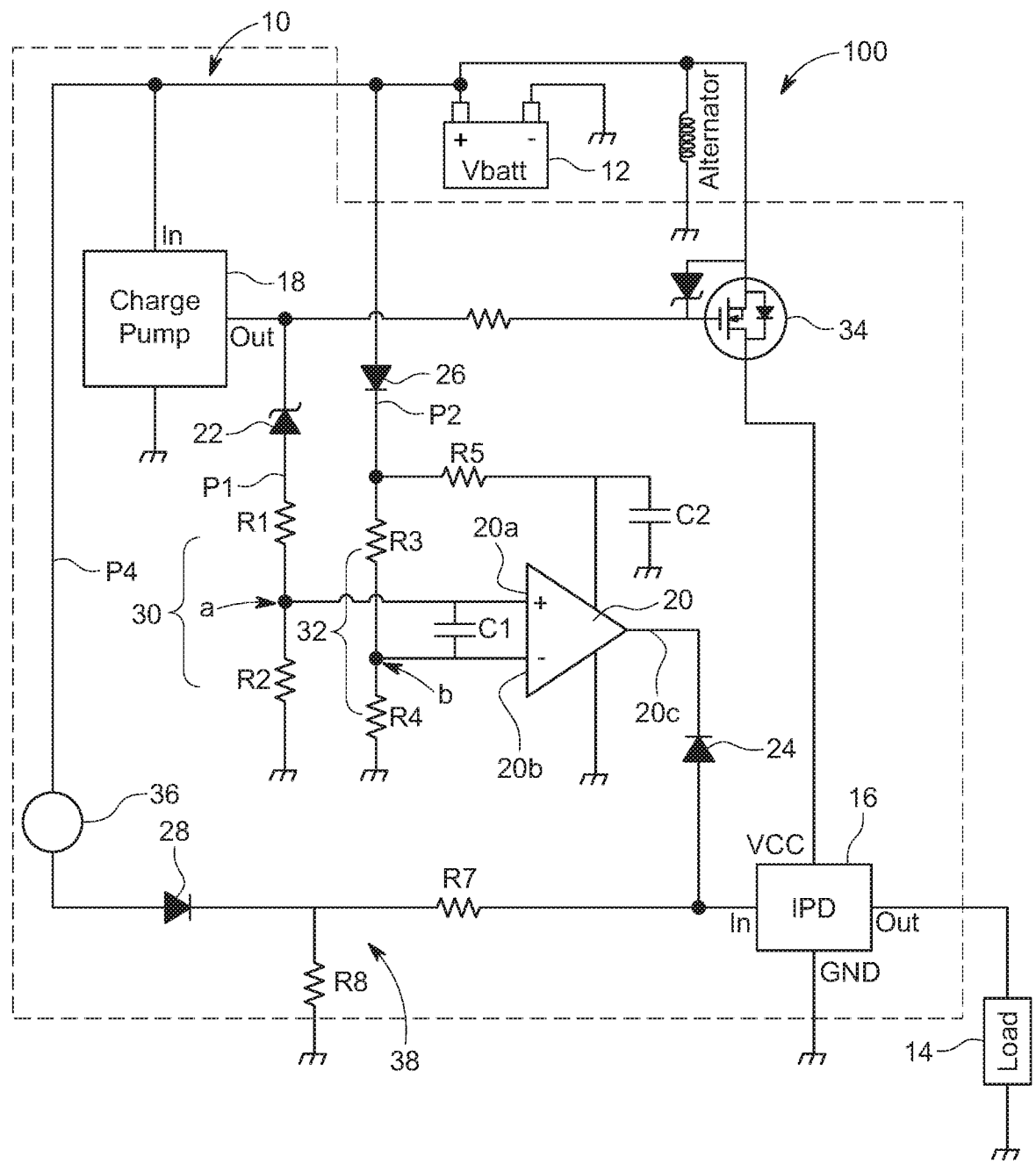
FIG. 5 is a schematic view depicting an electric system used in an automotive vehicle according to one or more embodiments described herein.

With reference now to FIG. 5, a third embodiment of the electric circuit 10 is provided. In the third embodiment, the electric circuit 10 is implemented in an electric system 100 having a battery 12 configured to power a load 14. The electric system 100 includes a charge pump 18 and a first semiconductor switch 34 having a gate terminal GT, a source terminal ST and a drain terminal DT. Preferably, the first semiconductor switch 34 is configured to protect the load 14 from a reverse battery condition. In one aspect, the first semiconductor switch 34 is a multi-channel semiconductor switch, such as an N-Channel FET.

The electric circuit 10 includes a comparator 20 having the functions described above. The comparator 20 includes a positive node 20a and a negative node 20b and an output 20c. A first conductive path P1 connects the charge pump 18 to the positive node 20a. A first diode 22 is disposed on the first conductive path P1 and is interposed between the charge pump 18 and the positive node 20a of the comparator 20. The first diode 22 is configured prevent a current from flowing charge pump 18 to the positive node 20a of the comparator 20 when a charge pump voltage is below a first predetermined voltage. In one aspect, the first diode 22 is a Zener diode. The Zener diode has a cathode that is connected to the charge pump 18 and an anode is connected to positive node 20a of the comparator 20. Accordingly, current from the charge pump 18 is blocked from reaching the positive node 20a of the comparator 20 when the voltage from the charge pump 18 is less than a Zener voltage. In other words, in such an aspect, the first predetermined voltage is the Zener voltage.

The first conductive path P1 may further include a first voltage divider 30 disposed on the first conductive path P1 between the charge pump 18 and the positive node 20a. The first voltage divider 30 is configured to divide the charge pump voltage at a first node ("A"). The first voltage divider 30 includes a first resistor R1 and a second resistor R2. The first resistor R1 and the second resistor R2 are on opposite sides of the first node "A", wherein the first resistor R1 is interposed between the first node "A" and the first diode 22. The second resistor R2 is connected to ground. As such the first voltage divider 30 is configured to reduce the voltage received by the positive node 20a of the comparator 20. It should be appreciated that the resistance of the first and second resistors 111, R2 are designed to provide a voltage that falls within the specification of the comparator 20.

The electric circuit 10 further includes a second conductive path P2 connecting the battery 12 to the negative node 20b. The second conductive path P2 also connects the battery 12 to a ground. The second conductive path P2 may further include a third diode 26. The third diode 26 is interposed between the battery 12 and the negative node 20b of the comparator 20. The third diode 26 is configured to prevent a reverse current from flowing to the battery 12.

The second conductive path P2 may further include a second voltage divider 32 disposed on the second conductive path P2 between the battery 12 and the negative node 20b. The second voltage divider 32 includes a third resistor R3 and a fourth resistor R4 disposed on opposite sides of a second node "B". The third resistor R3 is interposed between the second diode 24 and the second node "B". The fourth resistor R4 is interposed between the second node "B" and ground. As such the second voltage divider 32 is configured to reduce the voltage received by the negative node 20b of the comparator 20. It should be appreciated that the resistance of the third and fourth resistors R3, R4 are designed to provide a voltage that falls within the specification of the comparator 20.

A first capacitor C1 may be connected in parallel to the second conductive path P2 and is also connected to the ground. A fifth resistor R5 is interposed between the first capacitor C1 and the second conductive path P2. The fifth resistor R5 is configured to drop the voltage across the first capacitor C1. As such, it should be appreciated that the resistance of the fifth resistor R5 is based upon the operational specification of the first capacitor C1 and the voltage output of the battery 12.

The electric circuit 10 may include a second capacitor C2. The second capacitor C2 connects the first conductive path P1 to the second conductive path P2, so as to regulate power from the charge pump 18 and the battery 12. In particular, the second capacitor C2 helps reduce noise so as to help ensure that the voltage potential difference read by comparator 20 is accurate.

The electric circuit 10 further includes a third conductive path P3 connecting an output 20c of the comparator 20 to the IPD 16. A second diode 24 is disposed on the third conductive path P3. The second diode 24 includes an anode on a side connected to the IPD 16 and a cathode on a side of the second diode 24 connected to an output 20c of the comparator 20. The second diode 24 is configured to provide a current path from the anode to the cathode when a voltage potential as measured from the anode to the cathode is above a predetermined voltage and block current when the voltage potential as measured from the anode to the cathode is below the predetermined voltage.

A fourth conductive path P4 electrically connects the battery 12 to an input of the IPD 16. The fourth conductive path P4 may include a fourth diode 28 may be interposed between the battery 12 and the IPD 16. A cathode of the fourth diode 28 is connected to the input of the IPD 16 and the anode of the fourth diode 28 is connected to the battery 12. The fourth diode 28 is configured to prevent a reverse current from flowing to the battery 12. The fourth conductive path P4 may further include a second switch configured to connect the battery 12 to the input of the IPD 16 when the second switch is in a closed position.

A third voltage divider 38 may be disposed on the fourth conductive path P4 between the battery 12 and the input of the IPD 16. The third voltage divider 38 includes a sixth resistor R6 and a seventh resistor R7 disposed on opposite sides of a third node "C". The sixth resistor R6 is interposed between the input of the IPD 16 and the third node "C". The seventh resistor R7 is interposed between the third node "C" and ground. As such the third voltage divider 38 is configured to reduce the voltage received by the input of the IPD

16. It should be appreciated that the resistance of the sixth and seventh resistors R6, R7 are designed to provide a voltage that falls within the specification of the IPD 16.

The comparator 20 is configured to generate a high output signal when the charge pump voltage is greater than the battery voltage, wherein the second diode 24 generates an open circuit in the third conductive path P3 allowing the battery 12 to power the IPD 16 so as to turn the IPD 16 on and provide power to the load 14. The comparator 20 is configured to generate a low output signal when the charge pump voltage is less than the battery voltage wherein the a low voltage potential is created on the cathode of the second diode 24 relative to the anode of the second diode 24 causing current from the battery 12 to flow through the first diode 22 into the output 20c of the comparator 20 and to the ground node.

When the charge pump 18 is functioning properly, a constant voltage is measured at the positive node 20a. Accordingly, as described herein, the voltage at the positive node 20a of the comparator 20 is greater than the voltage at the negative node 20b, wherein the comparator 20 outputs a high signal and thus no current is passed through the second diode 24. As such, power is supplied to the IPD 16, turning on the IPD 16 so as to supply power to the load 14.

If the charge pump 18 fails to generate a charge pump voltage, the voltage at the negative node 20b of the comparator 20 is higher than the voltage at the positive node 20a of the comparator 20. As such, the comparator 20 generates a low output signal wherein the voltage at the cathode of the second diode 24 is low and the voltage at the anode of the second diode 24 is high, wherein current flowing from the battery 12 flows through the second diode 24, into the comparator 20 and into ground. Thus, the IPD 16 is turned off and is protected from the effects of a malfunctioning charge pump 18.

While particular embodiments have been illustrated and described herein, it should be appreciated and understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electric circuit for supplying power from a battery to a load, wherein an IPD is turned on or off so as to selectively connect the battery to the load, the electric circuit comprising:
   a charge pump for generating a charge pump voltage;
   a comparator having a positive node and a negative node and a ground node;
   a first conductive path from the charge pump to the positive node, a first diode configured prevent a current from flowing from the charge pump to the positive node of the comparator when a charge pump voltage is below a predetermined voltage;
   a second conductive path from the battery to the negative node, the second conductive path being connected to a ground; and
   a third conductive path connecting an output of the comparator to the IPD, a second diode disposed on the third conductive path an anode of the second diode on a side connected to the IPD and a cathode of the second diode connected to an output of the comparator; and
   wherein the comparator is configured to generate a high output signal when the charge pump voltage is greater than a battery voltage, wherein the second diode generates an open circuit in the third conductive path allowing the battery to power the IPD so as to turn the IPD on, and wherein the comparator is configured to generate a low output signal when the charge pump voltage is less than the battery voltage wherein a low voltage potential is created on the cathode of the second diode relative to the anode of the second diode causing current from the battery to flow through the first diode into the output of the comparator and to the ground node.

2. The electric circuit as set forth in claim 1, wherein the first diode is a Zener diode.

3. The electric circuit as set forth in claim 1, further including a first voltage divider disposed on the first conductive path between the charge pump and the positive node.

4. The electric circuit as set forth in claim 1, further including a second voltage divider disposed on the second conductive path between the battery and the negative node.

5. The electric circuit as set forth in claim 1, further including a first capacitor connected in parallel to the second conductive path and is also connected to the ground.

6. The electric circuit as set forth in claim 1, further including a second capacitor, the second capacitor connecting the first conductive path to the second conductive path.

7. An electric system having a battery configured to power a load, the electric system comprising:
   a charge pump;
   a first semiconductor switch having a gate terminal, a source terminal and a drain terminal,
   a comparator having a positive node, a negative node and an output;
   an intelligent powered device interposed between the switch and the load, wherein
   a first conductive path connects the charge pump to the positive node, a first diode is disposed on the first conductive path and is configured prevent a current from flowing charge pump to the positive node of the comparator when a charge pump voltage is below a predetermined voltage;
   a second conductive path connects the battery to the negative node, the second conductive path being connected to a ground; and
   a third conductive path connects an output of the comparator to the IPD, a second diode disposed on the third conductive path an anode of the second diode on a side connected to the semiconductor switch and a cathode of the second diode connected to an output of the comparator; and
   wherein the comparator is configured to generate a high output signal when the charge pump voltage is greater than a battery voltage, wherein the second diode generates an open circuit in the third conductive path allowing the battery to power the IPD so as to turn the IPD on, and wherein the comparator is configured to generate a low output signal when the charge pump voltage is less than the battery voltage, turning off the first semiconductor switch and wherein a low voltage potential is created on the cathode of the second diode relative to the anode of the second diode causing current from the battery to flow through the first diode into the output of the comparator and to the ground node.

8. The electric system as set forth in claim 7, wherein the first diode is a Zener diode.

9. The electric system as set forth in claim 7, further including a first voltage divider disposed on the first conductive path between the charge pump and the positive node.

10. The electric system as set forth in claim 7, further including a second voltage divider disposed on the second conductive path between the battery and the negative node.

11. The electric system as set forth in claim 7, further including a first capacitor disposed on the second conductive path, the first capacitor connected in parallel to the ground.

12. The electric system as set forth in claim 7, further including a second capacitor, the second capacitor connecting the first conductive path to the second conductive path.

* * * * *